(12) United States Patent
Okada

(10) Patent No.: US 8,362,363 B2
(45) Date of Patent: Jan. 29, 2013

(54) PREPREG WITH CARRIER AND PROCESS FOR MANUFACTURING SAME, MULTI-LAYERED PRINTED WIRING BOARD AND SEMICONDUCTOR DEVICE

(75) Inventor: Ryoichi Okada, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 522 days.

(21) Appl. No.: 12/530,209

(22) PCT Filed: Mar. 24, 2008

(86) PCT No.: PCT/JP2008/000688
§ 371 (c)(1),
(2), (4) Date: Nov. 24, 2009

(87) PCT Pub. No.: WO2008/129815
PCT Pub. Date: Oct. 30, 2008

(65) Prior Publication Data
US 2010/0065317 A1    Mar. 18, 2010

(30) Foreign Application Priority Data
Mar. 30, 2007   (JP) ................................ P2007-095139

(51) Int. Cl.
*H05K 1/03* (2006.01)
*B32B 27/00* (2006.01)
*B32B 37/00* (2006.01)

(52) U.S. Cl. .......... 174/258; 156/182; 156/60; 428/414; 428/411.1

(58) Field of Classification Search ................ 174/250, 174/255, 256, 258; 257/632–644, 701–702; 428/411.1–414, 480, 195.1, 212–214, 704, 428/118, 195; 156/182, 160, 285, 247, 60; 438/118, 624, 213
See application file for complete search history.

(56) References Cited

U.S. PATENT DOCUMENTS

| | | | | |
|---|---|---|---|---|
| 3,718,527 A * | 2/1973 | Goodman | .................... | 156/381 |
| 4,180,608 A * | 12/1979 | Del | ................. | 428/196 |
| 4,916,017 A * | 4/1990 | Nomi et al. | ................... | 428/413 |
| 6,713,144 B2 * | 3/2004 | Bundo et al. | ................. | 428/40.1 |
| 6,866,919 B2 * | 3/2005 | Ikeguchi et al. | ............. | 428/209 |
| 2004/0119188 A1 * | 6/2004 | Lowe | ............................ | 264/131 |

FOREIGN PATENT DOCUMENTS

| | | |
|---|---|---|
| JP | 02-110376 | 9/1990 |
| JP | 09087400 A * | 3/1997 |
| JP | 2001-212823 | 8/2001 |
| JP | 2004-123870 | 4/2004 |
| JP | 2004-342871 | 12/2004 |
| JP | 2006-152099 | 6/2006 |
| JP | 2006152099 A * | 6/2006 |
| JP | 2006160899 A * | 6/2006 |

* cited by examiner

*Primary Examiner* — Angel R Estrada
*Assistant Examiner* — Dimary Lopez
(74) *Attorney, Agent, or Firm* — Ditthavong Mori & Steiner, P.C.

(57) ABSTRACT

According to one aspect of the present invention, there is provided a prepreg with a carrier, comprising: a sheet-like base member; a first insulating resin layer provided to cover a surface of the sheet-like base member; a first carrier provided to cover the first insulating resin layer; a second insulating resin layer provided to cover a back surface of the sheet-like base member; and a second carrier provided to cover the second insulating resin layer, wherein the first and the second insulating resin layers have different resin compositions or the first and the second insulating resin layers have different thicknesses, and a front surface and a back surface of the prepreg with the carrier is visually identifiable.

11 Claims, 2 Drawing Sheets

PREPREG WITH CARRIER AND PROCESS FOR MANUFACTURING SAME, MULTI-LAYERED PRINTED WIRING BOARD AND SEMICONDUCTOR DEVICE

TECHNICAL FIELD

The present invention relates to a prepreg with a carrier and a process for manufacturing thereof, and a multi-layered printed wiring board, and a semiconductor device.

BACKGROUND ART

A multi-layered printed wiring board typically includes a large sized multi-layered printed wiring board for mother board and a small sized multi-layered printed wiring board for system-in-package (SiP) (referred to as a semiconductor package substrate). In recent years, as the high density packaging technology for semiconductor devices is advanced, semiconductor package substrates including micro interconnects have attracted attentions. When a semiconductor element is packaged on to a semiconductor package substrate via a flip-chip process in the conventional technology, such semiconductor package substrate is required to have sufficient mechanical strength for ensuring a certain packaging reliability. Therefore, an internal layer circuit board having a certain thickness for sufficient mechanical strength has been employed for such semiconductor package substrate. However, when two or more of such internal layer circuit boards are stacked under the circumstance that increased number of layers are required due to requirements for higher integration and higher packaging, the thickness of the obtained semiconductor package substrate is considerably increased.

The multi-layered printed wiring board is generally manufactured via a building-up process, in which insulating resin films and conductor circuit layers are alternately deposited over an internal layer circuit board. In the process for manufacturing the multi-layered printed wiring board by the building-up process, an insulating resin film with a carrier is employed for forming an insulating resin film. In the trend of reducing the thickness of the multi-layered printed wiring board, various investigations are also made on the insulating resin film with the carrier for the purpose of providing higher mechanical strength. For example, a process for obtaining a multi-layered printed wiring board having improved mechanical strength and packaging reliability by employing a prepreg with carrier employing a prepreg as an insulating resin film is proposed in Patent Document 1.

Further, a method for obtaining a prepreg by laminating insulating resin films on both sides of a glass cross with a roller laminator apparatus is disclosed as a process for manufacturing of a prepreg (for example, Patent Document 2). Such process for obtaining the prepreg with a roller laminator apparatus provides easier control of the thickness of the obtained prepreg, as compared with a process for immersing a sheet-like base material within a resin varnish and then drying thereof.

Further, in such process to be employed this roller laminator apparatus, a resin composition or a thickness of the insulating resin films laminated on both sides of the base material such as a glass cross, based on a desired design of a multi-layered printed wiring board.

However, when insulating resin films having different resin compositions and/or thicknesses are laminated on the front surface and the back surface of the base member, it is difficult to specify the front and the back surfaces of the obtained prepreg. This may cause erroneous laminations for the front and the back surface of the prepreg on the internal layer circuit board when a multiple-layered printed wiring board is manufactured employing such prepreg, causing a failure in the obtained multiple-layered printed wiring board. In addition, the failure of the multiple-layered printed wiring board may, in turn, stops the next operation in the process for manufacturing the semiconductor device employing the multiple-layered printed wiring board. Even if it is allowed to forward the operation in the process for manufacturing the semiconductor device, the semiconductor devices having sufficient packaging reliability may not be possibly obtained.

The present invention is, taking into account such situation, to provide a prepreg with a carrier, which provides a visual identification for front and back surfaces. The present invention is also to provide a multi-layered printed wiring board employing such prepreg with the carrier, which exhibits enhanced reliability. The present invention is also to provide a semiconductor device employing such multi-layered printed wiring board, which exhibits improved packaging reliability.

[Patent Document 1]
Japanese Patent Laid-Open No. 2004-342,871
[Patent Document 2]
Japanese Patent Laid-Open No. 2004-123,870

DISCLOSURE OF THE INVENTION

According to one aspect of the present invention, there is provided a prepreg with a carrier, comprising: a sheet-like base member; a first insulating resin layer provided to cover a surface of the sheet-like base member; a first carrier provided to cover the first insulating resin layer; a second insulating resin layer provided to cover a back surface of the sheet-like base member; and a second carrier provided to cover the second insulating resin layer, wherein the first and the second insulating resin layers have different resin compositions or the first and the second insulating resin layers have different thicknesses, and a front surface and a back surface of the prepreg with the carrier is visually identifiable.

According to another aspect of the present invention, there is provided a process for manufacturing the prepreg with the carrier as set forth in claim 1, including: forming the first insulating resin film with the carrier composed of the first carrier and the first insulating resin layer and the second insulating resin film with the carrier composed of the second carrier and the second insulating resin layer, the first insulating resin film with the carrier and the second insulating resin film with the carrier are visually identifiable; disposing the first insulating film with the carrier and the second insulating film with the carrier over the front surface and the back surface of the sheet-like base member, respectively, so that the first insulating resin layer and the second insulating resin layer are in contact with the sheet-like base member, and then joining thereof under a reduced pressure to obtain a multi-layered member; and heating the multi-layered member at a temperature of equal to or higher than melting temperatures for the first and the second insulating resin layers.

In the prepreg with the carrier of the present invention, the front surface and the back surface are visually identifiable. This reduces a possibility for erroneous laminations for the front and the back surface of the prepreg when the prepreg with the carrier is laminated on the internal layer circuit board to manufacture the multi-layered printed wiring board. This allows reducing a failure of the obtained multi-layered printed wiring board.

According to the present invention, a multi-layered printed wiring board obtained by stacking the above-described prepreg with the carrier and the internal layer circuit board is presented.

In addition, according to the present invention, the semiconductor device having the above-described multi-layered printed wiring board is presented.

BEST MODE FOR CARRYING OUT THE INVENTION

Prepregs with carriers of the present invention, multi-layered printed wiring boards employing such prepreg with the carrier, and semiconductor devices employing such multi-layered printed wiring board will be described in details as follows.

Figure 1:
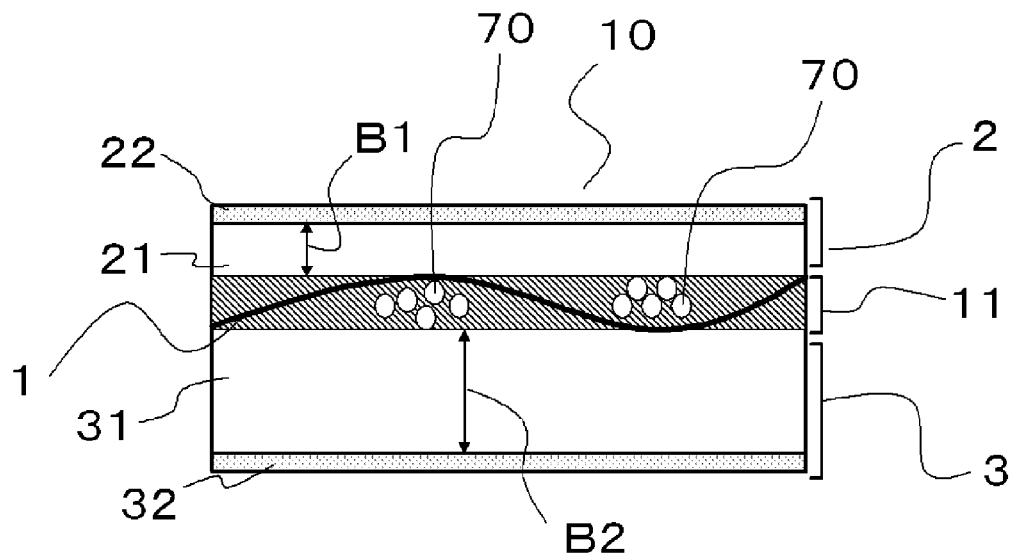
FIG. 1 It is a cross-sectional view of a prepreg with a carrier in an embodiment of the present invention.

FIG. 1 is a cross-sectional view of a prepreg with a carrier in an embodiment of the present invention. In this description, a top side of the prepreg with the carrier in the drawing is assumed to indicate a front surface, and a bottom side is assumed to indicate a backside, for the purpose of illustration.

A prepreg 10 with a carrier includes a sheet-like base member 1, a first insulating resin layer 21, a second insulating resin layer 31, a first carrier 22, and a second carrier 32. The first insulating resin layer 21 and the second insulating resin layer 31 are disposed so as to be in contact with a front surface and a back surface of the sheet-like base member 1, respectively. The sheet-like base member 1 constitutes a part of a core layer 11.

Such prepreg 10 with the carrier is manufactured by disposing a first insulating resin film 2 with a carrier composed of the first carrier 22 and the first insulating resin layer 21 and a second insulating resin film 3 with a carrier composed of the second carrier 32 and the second insulating resin layer 31 on the front surface and the back surface of the core layer 11, which is substantially composed of the sheet-like base member 1, so that the first and the second insulating resin layers 21 and 31 are in contact with the core layer 11. A resin composition of the first insulating resin layer 21 is different from a resin composition of the second insulating resin layer 31, or a thickness B1 of the first insulating resin layer 21 is different from a thickness B2 of second insulating resin layer 31.

(Core Layer)

The core layer 11 is substantially composed of the sheet-like base member 1. The core layer 11 is used in order to provide improved strength of the obtained prepreg 10 with the carrier. Typical materials employed for the sheet-like base member 1 include: glass fibers such as glass cloth and glass nonwoven fabric and the like; polyamide-based resin fibers such as polyamide resin fiber, aromatic polyamide resin fiber, wholly aromatic polyamide resin fiber and the like; polyester-based resin fibers such as polyester resin fiber, aromatic poly ester resin fiber, wholly aromatic polyester resin fiber and the like; synthetic fibers composed of woven clothes or non-woven fabrics containing polyimide resin fiber, fluororesin fiber and the like as a major constituent; and paper base members such as craft paper, cotton linter paper, mix paper of linter and craft pulp and the like, though it is not limited thereto. In order to obtain a prepreg having higher strength and lower thermal expansion coefficient, it is preferable to employ the glass fibers.

Typical glasses employed in the glass fiber include: E-glass; C-glass; A-glass; S-glass; D-glass; NE-glass; T-glass; H-glass, and the like, though it is not limited thereto. Among these, the use of the S-glass or the T-glass having lower thermal expansion coefficient is preferable. The use of the glass fiber composed of such type of glass provides a reduced thermal expansion coefficient of the obtained prepreg.

While the thickness of the sheet-like base member 1 is not particularly limited to any specific thickness, a thickness of equal to or lower than 30 μm is preferable for obtaining a prepreg with a thinner carrier, and further, a thickness of equal to or lower than 25 μm is more preferable, and a thickness of 10 to 20 μm is the most preferable. The thickness of the sheet-like base member 1 within the above-described ranges provides a well-balanced substrate between reduced film thickness and higher strength, as will be discussed later. Further, the prepreg with the carrier employing such sheet-like base member is employed for manufacturing the multi-layered printed wiring board to obtain a multi-layered printed wiring board, which exhibits enhanced processability and reliability in the conduction coupling between the insulating resin layers.

The core layer 11 may be formed by impregnating the sheet-like base member 1 with the resin constituting the first insulating resin layer 21 and/or the second insulating resin layer 31. Alternatively, the core layer 11 may also be formed by impregnating the sheet-like base member 1 with the resin, which is different from the resin constituting the first insulating resin layer 21 and the second insulating resin layer 31. Known resins ordinarily employed for the prepreg may be employed for the resin for the core layer 11.

(Insulating Resin Film with Carrier)

The insulating resin film with the carrier is obtained by forming an insulating resin layer composed of a resin composition on the carrier. Typical resins employed for the resin composition include thermosetting resins such as, for example: epoxy resin; phenolic resin; cyanate resin; unsaturated polyester resin; dicyclopenta diene resin and the like, though it is not limited thereto. In addition, such resin composition may additionally contain additives such as curing agent, cure accelerator, thermoplastic resin, inorganic filler, organic filler, coupling agent and the like, as required.

In the prepreg with the carrier of the present invention, the first insulating resin film 2 with the carrier and the second insulating resin film 3 with the carrier can visually identified to provide a visual identification of the front and the back of the prepreg with the carrier. For the identification of the first and the second insulating resin films 2 and 3 with the carriers, any one of the first insulating resin layer 21 and the second insulating resin layer 31 may contain a coloring agent, or both of these may contain different coloring agents.

Arbitrary coloring agents may be employed for the coloring agent, provided that the agent has sufficient colorability for distinguishing the first and the second insulating resin films 2 and 3 with the carriers. Typical examples for such coloring agent include: carbon black, burnt ocher, prussian blue, county blue, cobalt blue, chrome green, phthalocyanine blue, phthalocyanine green, iso-indolinone-based yellow, quinacridon-based red, perylene-based red, anthraquinone-based dye, perinone-based dye, diaminostilbene disultonic acid derivatives, imidazole derivatives, oxazole derivatives, coumarin derivatives, triazole derivatives, carbazole derivatives, pyridine derivatives, pyrazoline derivatives, naphthalic acid derivatives, imidazolone derivatives, and the like, though it is not limited thereto. These may be employed alone, or a combination thereof may also be employed.

Quantity of the employed coloring agent is not particularly limited, provided that the quantity is sufficient for visually identifying the first and the second insulating resin films 2 and 3 with the carriers. The quantity of the coloring agent may be preferably 0.01 to 3% wt. over the whole weight of the resin composition composing the insulating resin layer, and more preferably 0.01 to 0.1% wt. The quantity within the above range allows identifying these insulating resin layers without deteriorating the other characteristics of the first and the second insulating resin layers. A coloring agent may be employed for one of the first insulating resin layer 21 and the second insulating resin layer 31, or different coloring agents may be employed for the first insulating resin layer 21 and second insulating resin layer 31.

A resin film is employed for the carrier 22 and 32 employed in the insulating resin film 2 and 3 with the carrier. A film composed of a thermoplastic resin is preferably employed for the resin film. Typical thermoplastic resins include polyester, polyolefin, polyphenylene sulfide, polyvinylchloride, polytetrafluoroethylene, polyvinylidene fluoride, polyvinyl fluoride, polyvinyl alcohol, polycarbonate, polyimide, polyether ketone and the like, though it is not limited thereto. The film composed of such thermoplastic resin can be relatively easily stripped from the insulating resin film with the carrier. The surfaces of the carriers 22 and 32 in contact with the insulating resin layers 21 and 31 may be preferably demolding-treated with a demolding agent. Typical demolding agents include thermosetting silicone resin, modified silicone resin, long-chain alkyl group-containing resin polyolefin-based resin, fluorine-based resin, wax, and the like. The use of the demolding-treated carrier allows easy stripping of the carrier from the insulating resin film with the carrier, without damaging the feature of the insulating resin layer.

The first and the second carriers 22 and 32 can have different colors. This allows identifying the first insulating resin film 2 with the carrier and the second insulating resin film 3 with the carrier. The coloring of the carriers is achieved by adding a colorant such as pigment, dye and the like to the materials of the carriers during the manufacture of the carrier, or by coating the surfaces of the carriers with a colorant after the manufacture of the carriers.

Alternatively, a marking such as a character or a symbol may be provided on the surfaces of the first and the second carrier 22 and 32. This allows indentifying the first insulating resin film 2 with the carrier and the second insulating resin film 3 with the carrier. Typical method for providing a marking on the carrier include printing, punching, air pen-marking, a process employing an ink jet printer, a process employing a laser marker, and the like. Among these, the process employing an ink jet printer or a laser marker may be preferable, since these processes allow the printing without a need for being in contact with the carriers.

Typical process for manufacturing the insulating resin film with the carrier includes, for example, coating the surface of the carrier with a resin varnish obtained by dissolving or dispersing a resin composition in an organic solvent to form the insulating resin layer, though it is not limited thereto. Typical process for coating the surface of the carrier with the resin varnish includes a process for coating with a coating device such as a comma coater (registered trade mark), a knife coater and the like, and a process for coating with a sprayer such as a spray-nozzle and the like. Among these, it is preferable to employ a coating device, since the control of the thickness of the obtained insulating resin layer is easier. After the carrier surface is coated with the resin varnish, the surface may be dried at an ambient temperature or with a heat, as required, to remove the organic solvent contained in the resin varnish.

(Manufacture of the Prepreg with the Carrier)

Next, the process for manufacturing the prepreg with the carrier of the present invention will be described. The process for manufacturing the prepreg with the carrier of the present invention includes disposing the first insulating film 2 with the carrier composed of the first carrier 22 and the first insulating resin layer 21 and the second insulating film 3 with the carrier composed of the second carrier 32 and the second insulating resin layer 31 on the front surface and the back surface of the sheet-like base member 1, respectively, so that the first insulating resin layer 21 and the second insulating resin layer 31 are in contact with the sheet-like base member 1, and then joining thereof under a reduced pressure to obtain a multi-layered member; and heating the multi-layered member at a temperature of equal to or higher than melting temperatures for the first and the second insulating resin layers 21 and 31.

Figure 3:
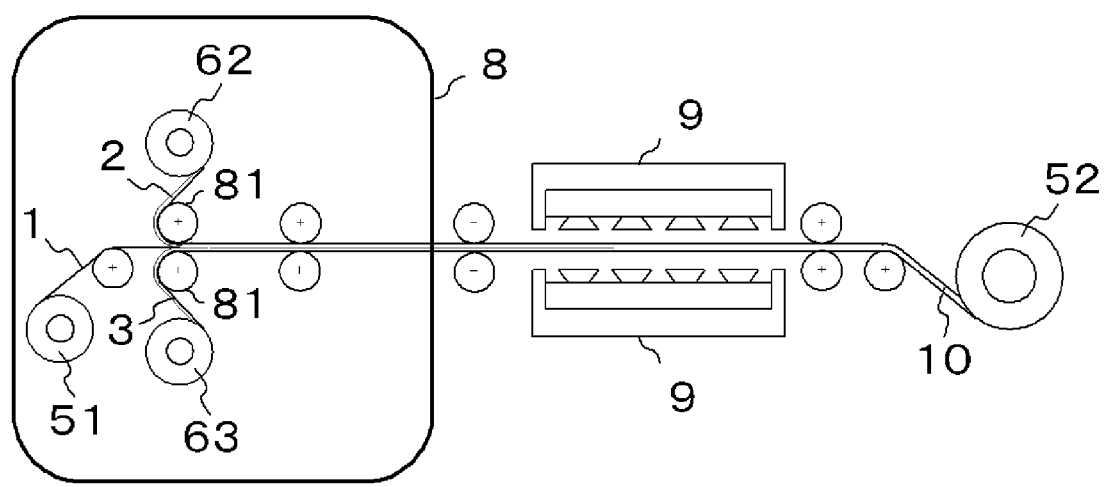
FIG. 3 It is a schematic diagram, showing a process for manufacturing a prepreg with a carrier of the present invention.

FIG. 3 is a schematic diagram, showing an example of a process for manufacturing the prepreg with the carrier of the present invention shown in FIG. 1. In a vacuum laminate device 8, the first insulating resin film 2 with the carrier is supplied from a first supply roll 62 disposed in the upper side of the sheet-like base member 1 and the second insulating resin film 3 with the carrier is supplied from a second supply roll 63 disposed in the lower side of the sheet-like base member 1 to the both side of the sheet-like base member 1 transferred by a base member supply roll 51. Here, the first and the second insulating resin films 2 and 3 with the carriers are supplied so that the insulating resin layers 21 and 31 are in contact with the sheet-like base member 1. These are unified by passing though a pair of the laminate rolls 81. These unified laminated materials are mutually joined in the vacuum laminate device 8 under a reduced pressure. Having such configuration, even if a gap 70 is present in the inside of the sheet-like base member 1 or in a junction between the sheet-like base member and the first insulating resin layer 21 or the second insulating resin layer 31, this can be a reduced pressure void or a vacuum void.

Then, the obtained laminated material is transferred to a hot air drier 9 from the vacuum laminate device 8. In the hot air drier 9, such laminated material is heated at a temperature of equal to or higher than the melting temperature of the first and the second insulating resin layers 21 and 31 at the atmospheric pressure. This allows the insulating resin layer being fluidized, so that the reduced pressure void or the vacuum void 70 generated in the previous unification operation can be removed. Therefore, the prepreg 10 with the carrier without a void can be obtained. While the hot air drier 9 is employed in the present embodiment, for example, an infrared heating device, a heating roller device, a flat plate type heat panel press device and the like may also be employed. The obtained prepreg 10 with the carrier is wound with a winding roll 52, and is withdrawn.

The use of the above-described process allows easy manufacture of the prepreg 10 with the carrier, even if a thinner sheet-like base member 1 having a thickness of equal to or lower than 25 μm is employed. The multi-layered printed wiring board is manufactured by employing such prepreg 10 with the carrier to obtain the multi-layered printed wiring board having a smaller thickness.

On the other hand, when a sheet-like base member having a thickness of equal to or smaller than 30 μm is impregnated with a resin composition composed of a thermosetting resin in the process for manufacturing a conventional prepreg, a stress is exerted over the sheet-like base member during a transfer through multiple transfer rolls or during a adjustment of a quantity of the resin composition employed for the impregnation for the sheet-like base member, possibly leading to a distortion (for example, expansion) of the sheet-like base member or a break of the sheet-like base member during the winding.

While the conventional process for manufacturing the prepreg (for example, a process for coating the sheet-like base member with a resin varnish with an ordinary coating device, and then drying thereof) cannot provide a different thickness of the insulating resin layer applied over the front and the back surfaces of the sheet-like base member, it is easy to provide different thickness of the insulating resin layer on the front and the back surfaces according to the process of the present invention.

The above-described process for manufacturing the prepreg with the carrier of the present invention may include an operation for providing a marking on the carrier. The operation for providing the marking to the carrier may be achieved by providing markings on the first and the second carriers 22 and 32 with an inkjet printer or a laser marker, after the first insulating resin film 2 with the carrier and the second insulating resin film 3 with the carrier are disposed on the sheet-like base member 1 and are joined with a laminate roll 81, and before the laminated material is transferred in the hot air drier 9. Such operation for providing the marking may be conducted after the heating operation with the hot air drier 9 and before being wound with the winding roll 52. Alternatively, such operation for providing the marking may also be conducted after winding the prepreg 10 with the carrier with the winding roll 52, or may be conducted after cutting the obtained the prepreg 10 with the carrier into a desired dimension.

The multi-layered printed wiring board employing the prepreg with the carrier of the present invention will be described below.

Figure 2:
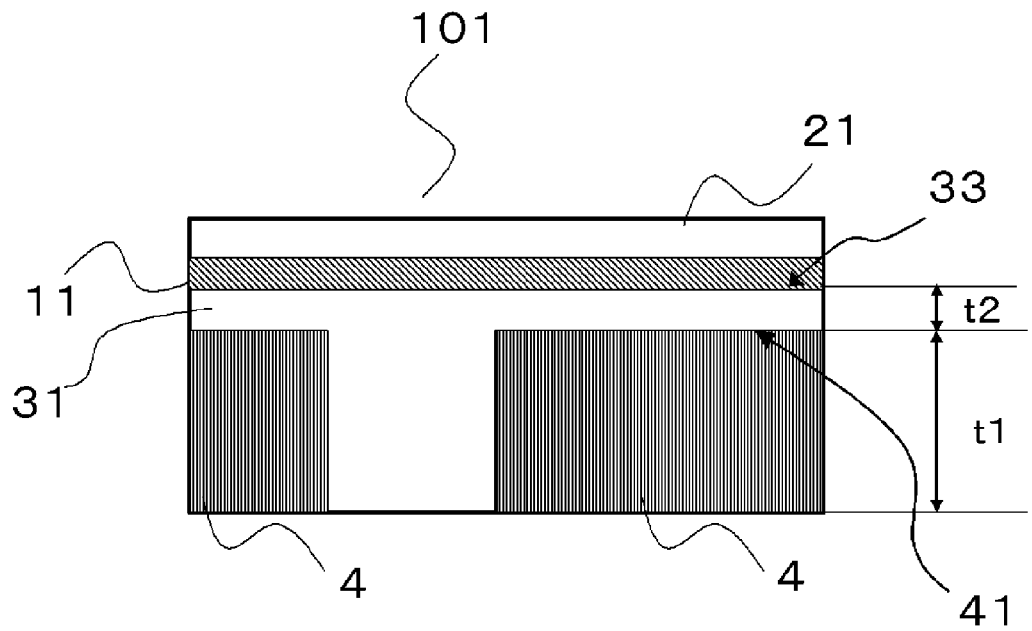
FIG. 2 It is a cross-sectional view of a multi-layered printed wiring board in an embodiment of the present invention.

FIG. 2 is a cross-sectional view of a multi-layered printed wiring board in an embodiment of the present invention. A multi-layered printed wiring board 101 includes an internal layer circuit board 4, and a prepreg laminated over such internal layer circuit board 4 after stripping the first and the second carriers 22 and 32. While the multi-layered printed wiring board 101 shown in FIG. 2 is configured that the second insulating resin layer 31 is in contact with the internal layer circuit board 4, the multi-layered printed wiring board of the present invention is not limited to such configuration.

The multi-layered printed wiring board 101 is formed by stacking the prepreg(s) 10 with the carrier(s) shown in FIG. 1 over one side or both sides of the internal layer circuit board 4, and then heating and pressurizing thereof. More specifically, the multi-layered printed wiring board 101 may be obtained by stripping the second carrier 32 of the prepreg 10 with the carrier of the present invention, laminating the prepreg 10 and the internal layer circuit board 4 so that the internal layer circuit board 4 is in contact with the second insulating resin layer 31, and then heating and pressurizing thereof within a vacuum with a vacuum-pressurizing laminator or the like, and then thermally curing the first and the second insulating resin layer 21 and 31 with a hot air drier or the like.

Here, in the operation for heating and pressurizing the laminated prepreg 10 and the internal layer circuit board 4, conditions of a temperature of 60 degrees C. to 160 degrees C. and a pressure of 0.2 MPa to 3.0 MPa may be employed. In addition, in the operation for thermally curing the first and the second insulating resin layer 21 and 31, conditions of a temperature of 140 degrees C. to 240 degrees C. and a duration time of 30 minutes to 120 minutes may be employed.

Alternatively, the multi-layered printed wiring board 101 may be also obtained by stripping the second carrier 32 of the prepreg 10 with the carrier shown in FIG. 1, laminating the prepreg 10 and the internal layer circuit board 4 so that the internal layer circuit board 4 is in contact with the second insulating resin layer 31, and then heating and pressurizing thereof with a flat plate pressing device or the like, and then thermally curing the first and the second insulating resin layer 21 and 31. Here, in the operation for heating and pressurizing the laminated prepreg and the internal layer circuit board 4, conditions of a temperature of 140 degrees C. to 240 degrees C. and a pressure of 1 MPa to 4 MPa may be employed.

In addition to above, a circuit board obtained by forming a predetermined circuit in the both sides of a copper-clad multiple-layered board via an etching process or the like, and then conducting a blackened process for the section of the circuit may be preferably employed for the internal layer circuit board 4 employed in the multi-layered printed wiring board 101.

Here, the thicknesses of the first insulating resin layer 21 and the second insulating resin layer 31 of the prepreg 10 with the carrier and the multi-layered printed wiring board 101 of the present invention will be described.

As shown in FIG. 2, it is assumed in the multi-layered printed wiring board 101 that the thickness of the internal layer circuit board 4 is represented by t1, and a distance from an upper end section 41 of the internal layer circuit board 4 to an upper end section 33 of the second insulating resin layer 31 is represented by t2. It is also assumed as described above that the thickness of the first insulating resin layer 21 of the prepreg with the carrier shown in FIG. 1 is represented by B1, and the thickness of the second insulating resin layer 31 is represented by B2. It is further assumed that a ratio of a dimensional area of the circuit over the dimensional area of the entire internal layer circuit board 4 is represented by S. It is preferable that the multi-layered printed wiring board 101 of the present invention satisfies the following formula (1).

$$B2 = t1 \times (1-S) + t2 \qquad \text{formula (1)}.$$

The thickness t2 may be preferably 0.1 µm to 5 µm, and more preferably 1 µm to 3 µm. The thickness t2 of smaller than 0.1 µm may possibly cause a contact of the internal layer circuit board 4 with the sheet-like base member 1. On the other hand, the thickness t2 of larger than 5 µm leads to an increased thickness of the multi-layered printed wiring board 101. The thickness t2 within the above-described range provides better covering capability of the internal layer circuit board 4, allowing thinner multiple-layered printing circuit board.

The thickness B1 of the first insulating resin layer 21 in the prepreg 10 with the carrier may be preferably 0.1 µm to 5.0 µm, and more preferably 1 µm to 3 µm. The thickness B1 of smaller than 0.1 µm may possibly cause a contact of the internal layer circuit board with the sheet-like base member 1 by a pressure generated when an additional internal layer circuit board is further laminated on the first insulating resin layer 21. On the other hand, the thickness B2 of larger than 5 µm leads to an increased thickness of the multi-layered printed wiring board 101.

Further, the first carrier 22 is striped, the first insulating resin layer 21 and the second insulating resin layer 31 are cured, and then the first insulating resin layer 21 is roughened with an oxidizing agent such as dichromate or the like, and then an electrically conducting interconnect circuit is formed via a metallic plating process to further form an additional interconnect circuit on the multi-layered printed wiring board 101 obtained as described above.

The multi-layered printed wiring board 101 of the present invention thus obtained may be employed for the manufacture of the semiconductor device. The semiconductor device may be obtained by installing a semiconductor chip on the above-described multi-layered printed wiring board 101, and encapsulating thereof with a semiconductor resin. Known processes in the technical field of the present invention may be employed as an installation process and an encapsulating process for a semiconductor chip.

EXAMPLES

The present invention will be described in the details in reference to examples hereinafter, though the present invention is not limited thereto.

Example 1

1. Preparation of the Resin Varnish for First Insulating Resin Layer 24 parts by weight of novolac cyanate resin (commercially available from Lonza Japan, Primaset PT-30, weight-average molecular weight of about 2,600) as a thermosetting resin; 24 parts by weight of biphenyl dimethylene epoxy resin (commercially available from Nippon Kayaku, NC-3000, weight per epoxy equivalent of 275) as an epoxy resin; 11.8 parts by weight of phenoxy resin of a copolymer of bisphenol A based epoxy resin and bisphenol F type epoxy resin ad having epoxy group at the terminal site (commercially available from Japan Epoxy Resin, EP-4275, weight-average molecular weight of 60,000) as a phenoxy resin; and 0.2 parts by weight of imidazole compound (commercially available from Shikoku Chemicals, "2-phenyl-4,5-dihydroxymethyl imidazole") as a curing catalyst, were dissolved in methyl ethyl ketone. 39.8 parts by weight of spherical fused silica (commercially available from Admatex, SO-25H, mean particle diameter of 0.5 μm) as an inorganic filler, and 0.2 parts by weight of epoxy silane coupling agent (commercially available from Nippon Unicar, A-187) were added to the obtained mixture. Further, 0.05 parts by weight of dye (commercially available from Nippon Kayaku, KAYASETBLACKAN) as a colorant was added to such mixture, and then the mixture was stirred with a high speed stirrer for 60 minutes to obtain a resin varnish for the first insulating resin layer of a solid content of 60% wt.

2. Preparation of the Resin Varnish for the Second Insulating Resin Layer 15 parts by weight of novolac cyanate resin (commercially available from Lonza Japan, Primaset PT-30, weight-average molecular weight of about 2,600) as a thermosetting resin; 8.7 parts by weight of biphenyl dimethylene epoxy resin (commercially available from Nippon Kayaku, NC-3000, weight per epoxy equivalent of 275) as an epoxy resin; and 6.3 parts by weight of biphenyl dimethylene phenolic resin (commercially available from Nippon Kayaku, GPH-65, hydroxyl equivalent of 200) as a phenolic resin was dissolved in methyl ethyl ketone. 69.7 parts by weight of spherical fused silica (commercially available from Admatex, SO-25 H, mean particle diameter of 0.5 μm) as an inorganic filler, and 0.3 parts by weight of epoxy silane coupling agent (commercially available from Nippon Unicar, A-187) were added to the obtained mixture, and then the mixture was stirred with a high speed stirrer for 60 minutes to obtain a resin varnish for the second insulating resin layer of a solid content of 60% wt.

3. Manufacture of the Insulating Resin Film with the Carrier

Transparent and colorless polyethylene terephthalate film (commercially available from Mitsubishi Chemical Polyester, SFB-38, thickness of 38 μm, width of 480 mm) serving as carrier was coated with the resin varnish for the first insulating resin layer as obtained above with a comma coater and then the coated film was dried for 3 minutes with a dryer at 170 degrees C. so as to dispose an insulating resin layer of a thickness of 9 μm and a width of 410 mm in the center in the width direction of the carrier to obtain the first insulating resin film with the carrier. Further, a similar process was conducted to obtain the second insulating resin film with the carrier having a resin layer of a thickness of 14 μm and a width of 410 mm disposed in the center in the width direction of the carrier film.

4. Manufacture of the Prepreg with the Carrier

A glass cloth (cloth type #1015, width of 360 mm, thickness of 15 μm and grammage of 17 g/m$^2$) serving as a sheet-like base member, and the above-described first insulating resin film with the carrier and the second insulating resin film with the carrier were employed, and the above-described process employing the vacuum laminate device and the hot air drier shown in FIG. 3 was employed to manufacture the prepreg with the carrier.

More specifically, the above-described first insulating resin film with the carrier was laminated on one surface of the glass cloth, and the above-described second insulating resin film with the carrier was laminated on the other surface thereof so that the insulating resin layer was in contact with the glass cloth. In such case, the lamination was conducted so that the center in the width direction of the insulating resin layer coincided with the center in the width direction of the glass cloth. Then, such laminated materials were unified within a vacuum laminate device under a reduced pressure of 1330 Pa at a temperature of 80 degrees C. Then, such laminated materials were heated and dried without a pressure within a hot air drier of a lateral transfer type set at a temperature of 120 degrees to obtain the prepreg with the carrier. The obtained prepreg with the carrier has a thickness 30 μm (thickness of the first insulating resin layer: 5 μm; thickness of glass cloth: 15 μm; and thickness of the second insulating resin layer: 10 μm).

5. Manufacture of the Multi-Layered Printed Wiring Board

The above-described prepregs with the carriers without the second carrier, which was stripped off, were deposited on both sides of the internal layer circuit board to obtain the multi-layered printed wiring board. More specifically, the second carrier was stripped from the two of the above-described prepreg with the carrier, and the lamination on both sides of the internal layer circuit board having the internal layer circuits formed on both sides was carried out so that the second insulating resin layer was in contact with the internal layer circuit board. Such laminated materials were heated and pressurized with a vacuum-pressurizing laminator at a temperature of 100 degrees C. a pressure of 1 MPa within a vacuum. The obtained laminated material was heated with a hot air drier at 170 degrees C. for 60 minutes to cure the first and the second insulating resin layers, and then the first carrier was stripped. In addition to above, a halogen-free FR-4 material (thickness of 0.4 mm) having an electrical conductor layer (copper foil thickness: 18 µm; L/S=120/180 µm; clearance hole: 1 mmΦ, 3 mm; slit width: 2 mm) was employed for the internal layer circuit board.

Then, an opening was provided in the first insulating resin layer by employing a carbonic acid laser equipment. Then, an exterior circuit was formed in the front surface of the first insulating resin layer via an electric field copper plating process, and an electric conduction of the exterior circuit with the internal layer circuit board was created. Then, an electrode section for the connection employed for installing the semiconductor element was provided in the exterior circuit. Then, a solder resist (commercially available from Taiyo Ink, PSR4000/AUS308) was formed on such exterior circuit, and an exposure and a development were conducted to expose the electrode section for connection, and thereafter a nickel-gold plating was conducted, and the material was cut into a dimension of 50 mm×50 mm to obtain the multi-layered printed wiring board.

5. Manufacture of the Semiconductor Device

The multi-layered printed wiring board as obtained above and the semiconductor element were employed to manufacture the semiconductor device. More specifically, a semiconductor element (TEG chip, size 15 mm×15 mm, thickness 0.8 mm) having a solder bump composed of Sn/Pb eutectic crystal and a positive photopolymer (commercially available from Sumitomo Bakelite, CRC-8300) was employed for the semiconductor element. First of all, a flux material was uniformly applied over such solder bump of the semiconductor element, via a transfer process. Next, such semiconductor element was disposed on the above-described multi-layered printed wiring board, and a heating process and a compressively bonding process were carried out with a flip-chip bonder to install the semiconductor element on the multi-layered printed wiring board. Next, the solder bump was melted with an IRFI flow furnace to be joined to the multi-layered printed wiring board. Then, such semiconductor resin was encapsulated with a liquid encapsulating resin (commercially available from Sumitomo Bakelite, CRP-4152S), and then the encapsulating resin was cured to obtain the semiconductor device. In addition to above, the cure of the encapsulating resin was conducted by heating at a temperature of 150 degrees C. for 120 minutes.

Example 2

1. Preparation of the Resin Varnish for the First Insulating Resin Layer

The resin varnish for the first insulating resin layer was prepared similarly as in Example 1 except that a colorant (commercially available from Nippon Kayaku, KAYASET-BLACKAN) was not employed in the process for preparing the varnish for the first insulating resin layer.

2. Preparation of the Resin Varnish for the Second Insulating Resin Layer

The resin varnish for the second insulating resin layer similarly as in Example 1 was prepared.

3. Manufacture of the Prepreg with the Carrier

The prepreg with the carrier was manufactured similarly as in Example 1, except that a white polyethylene terephthalate film (commercially available from Teijin-DuPont, Teijin Tetoron film UH6, thickness: 38 µm) was employed as the carrier for the first the insulating resin film with the carrier.

Comparative Example 1

The resin varnish for the first insulating resin layer was prepared in a similar way as employed in Example 1 except that a colorant (commercially available from Nippon Kayaku, KAYASETBLACKAN) was not employed in the process for preparing the resin varnish for the first insulating resin layer.
(Results)

Appearances of the prepregs with the carriers obtained as described above were visually observed. Visual identification for the first insulating resin layer and the second insulating resin layer was easily achieved in the prepreg with the carrier in Example 1 and the prepreg with the carrier in Example 2. On the contrary, visual identification for the first insulating resin layer and the second insulating resin layer was not achieved in the prepreg with the carrier of Comparative Example 1.

Since the identification for the front and back surfaces is possible in the prepreg with the carrier in Example 1 and the prepreg with the carrier in Example 2, it can be considered that the multi-layered printed wiring board can be produced with higher efficiency. It is also considered that the manufacture of the semiconductor device employing such multi-layered printed wiring board can be achieved with enhanced production yield. On the other hand, the front surface and the back surface cannot be identified for the prepreg with the carrier of Comparative Example 1, in which the composition and the thickness of the second insulating resin layer are different from the first insulating resin layer and the color is the same. Therefore, erroneous laminations for the front and the back surface may possibly be caused for the prepreg with the carrier of Comparative Example 1, when it is employed in the manufacture of the multi-layered printed wiring board. Further, such erroneous arrangement may possibly cause a failure in the obtained multi-layered printed wiring board.

The invention claimed is:

1. A prepreg with a carrier, comprising:
   a prepreg comprising:
      a sheet-like base member;
      a first insulating resin layer provided to cover a surface of said sheet-like base member; and
      a second insulating resin layer provided to cover a back surface of said sheet-like base member;
   a first carrier provided to cover said first insulating resin layer; and
   a second carrier provided to cover said second insulating resin layer,
   wherein said first and said second insulating resin layers have different resin compositions or said first and said second insulating resin layers have different thicknesses,
   said first and said second insulating resin layers have different colors in an entirety of each of said first and said second insulating resin layers, or said first and said second carriers have different colors, and
   a front surface and a back surface of said prepreg with the carrier is visually identifiable.

2. A process for manufacturing the prepreg with the carrier as set forth in claim 1, including:
   forming the first insulating resin film with the carrier composed of the first carrier and the first insulating resin layer and the second insulating resin film with the carrier composed of the second carrier and the second insulating resin layer, said first insulating resin film with the carrier and said second insulating resin film with the carrier being visually identifiable;

disposing said first insulating film with the carrier and said second insulating film with the carrier over the front surface and the back surface of the sheet-like base member, respectively, so that said first insulating resin layer and said second insulating resin layer are in contact with the sheet-like base member, and then joining thereof under a reduced pressure to obtain a multi-layered member; and heating said multi-layered member at a temperature of equal to or higher than melting temperatures for said first and said second insulating resin layers.

3. The prepreg with a carrier as set forth in claim 1, wherein said first carrier and said second carrier are composed of resin films.

4. A multi-layered printed wiring board, obtained by depositing the prepreg with the carrier as set forth in claim 1 and an internal layer circuit board.

5. A prepreg with a carrier, comprising:
a prepreg comprising:
  a sheet-like base member;
  a first insulating resin layer provided to cover a surface of said sheet-like base member; and
  a second insulating resin layer provided to cover a back surface of said sheet-like base member;
a first carrier provided to cover said first insulating resin layer; and
a second carrier provided to cover said second insulating resin layer, said first carrier or said second carrier having a marking on a surface thereof, the marking being composed of a character or a symbol,
wherein said first and said second insulating resin layers have different resin compositions or said first and said second insulating resin layers have different thicknesses, and a front surface and a back surface of said prepreg with the carrier is visually identifiable.

6. A process for manufacturing the prepreg with the carrier as set forth in claim 5, including:

forming the first insulating resin film with the carrier composed of the first carrier and the first insulating resin layer and the second insulating resin film with the carrier composed of the second carrier and the second insulating resin layer, said first insulating resin film with the carrier and said second insulating resin film with the carrier being visually identifiable;

disposing said first insulating film with the carrier and said second insulating film with the carrier over the front surface and the back surface of the sheet-like base member, respectively, so that said first insulating resin layer and said second insulating resin layer are in contact with the sheet-like base member, and then joining thereof under a reduced pressure to obtain a multi-layered member; and heating said multi-layered member at a temperature of equal to or higher than melting temperatures for said first and said second insulating resin layers.

7. The prepreg with a carrier as set forth in claim 5, wherein said marking is a marking provided by an inkjet printer.

8. The prepreg with a carrier as set forth in claim 5, wherein said marking is a marking provided by a laser marker.

9. The prepreg with a carrier as set forth in claim 5, wherein said first carrier and said second carrier are composed of resin films.

10. A multi-layered printed wiring board, obtained by depositing the prepreg with the carrier as set forth in claim 5 and an internal layer circuit board.

11. A semiconductor device having the multi-layered printed wiring board as set forth in claim 10.

* * * * *